(12) United States Patent
Hollis

(10) Patent No.: US 7,936,812 B2
(45) Date of Patent: May 3, 2011

(54) FRACTIONAL-RATE DECISION FEEDBACK EQUALIZATION USEFUL IN A DATA TRANSMISSION SYSTEM

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 708 days.

(21) Appl. No.: 11/772,642

(22) Filed: Jul. 2, 2007

(65) Prior Publication Data

US 2009/0010320 A1    Jan. 8, 2009

(51) Int. Cl.
H03H 7/30    (2006.01)

(52) U.S. Cl. .................................. 375/233; 375/234

(58) Field of Classification Search .......... 375/229, 375/232–234, 316
See application file for complete search history.

(56) References Cited

U.S. PATENT DOCUMENTS

| | | | |
|---|---|---|---|
| 6,728,324 B1 | 4/2004 | Shan et al. | |
| 6,904,110 B2 | 6/2005 | Trans et al. | |
| 7,095,245 B2 * | 8/2006 | Zumkehr et al. | 326/16 |
| 7,433,397 B2 * | 10/2008 | Garlepp et al. | 375/229 |
| 7,590,175 B2 * | 9/2009 | Leibowitz et al. | 375/229 |
| 7,627,029 B2 * | 12/2009 | Ho et al. | 375/229 |
| 2006/0029164 A1 | 2/2006 | Hwang | |
| 2008/0240218 A1 * | 10/2008 | Sumesaglam | 375/229 |
| 2009/0316767 A1 * | 12/2009 | Hidaka | 375/232 |
| 2009/0316771 A1 * | 12/2009 | Hidaka | 375/233 |
| 2009/0316772 A1 * | 12/2009 | Hidaka | 375/233 |
| 2010/0061499 A1 * | 3/2010 | Mijuskovic | 375/375 |

OTHER PUBLICATIONS

International Preliminary Report on Patentability regarding corresponding PCT application No. PCT/US2008/065843, dated Jan. 14, 2010.
International Search Report regarding PCT Application No. PCT/US2008/065843, dated Dec. 29, 2008.
M.E. Austin, "Decision-feedback equalization for digital communication dispersive channels," Massachusetts Institute of Technology: Research Laboratory of Electronics, Cambridge, Tech. Rep. 461 (1967).
R.S. Kajley et al., "A mixed-signal decision-feedback equalizer that uses a look-ahead architecture," IEEE J. Solid-State Circuits, vol. 32, No. 3, pp. 450-459 (Mar. 1997).
A. Emami-Neyestanak, et al., "A 6.0-mW 10.0-Gb/s receiver with switched-capacitor summation DFE," IEEE Journal of Solid-State Circuits, vol. 42, No. 4, pp. 889-896 (Apr. 2007).

(Continued)

*Primary Examiner* — Tesfaldet Bocure
*Assistant Examiner* — Lawrence B Williams
(74) *Attorney, Agent, or Firm* — Wong, Cabello, Lutsch, Rutherford & Brucculeri, LLP

(57) ABSTRACT

Decision feedback equalization (DFE) circuits are disclosed for use with fractional-rate clocks of lesser frequency than the data signal. For example, a one-half-rate clocked DFE circuit utilizes two input data paths, which are respectively activated on rising and falling edges of an associated half-rate clock. Each of the input data paths has a pair of comparators with differing reference voltage levels. The comparators in each input data path output to a multiplexer, which picks between the two comparator outputs depending on the logic level of the previously received bit. The output of each input data path is sent as a control input to the multiplexer of the other data path. Thus, the results from previously-detected bits affect which comparator's output is passed to the output of the circuit, even though the synchronizing clock is half the frequency of the data. A quarter-rate DFE circuit is also disclosed which operates similarly.

55 Claims, 14 Drawing Sheets

OTHER PUBLICATIONS

J. Zerbe, et al., "Comparison of adaptive and non-adaptive equalization methods in high-performance backplanes," proceedings of DesignCon (Jan.-Feb. 2005).

C.R. Gauthier, et al., "Dynamic receiver biasing for inter-chip communication," Proceedings of the Conference on Advanced Research in VLSI (2001).

* cited by examiner

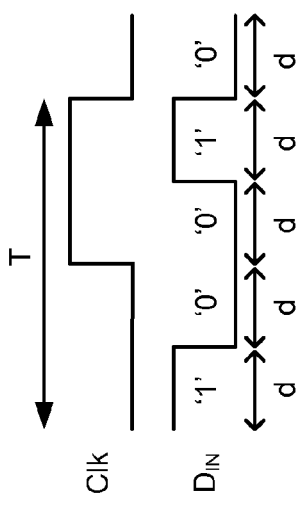
*Figure 5B*
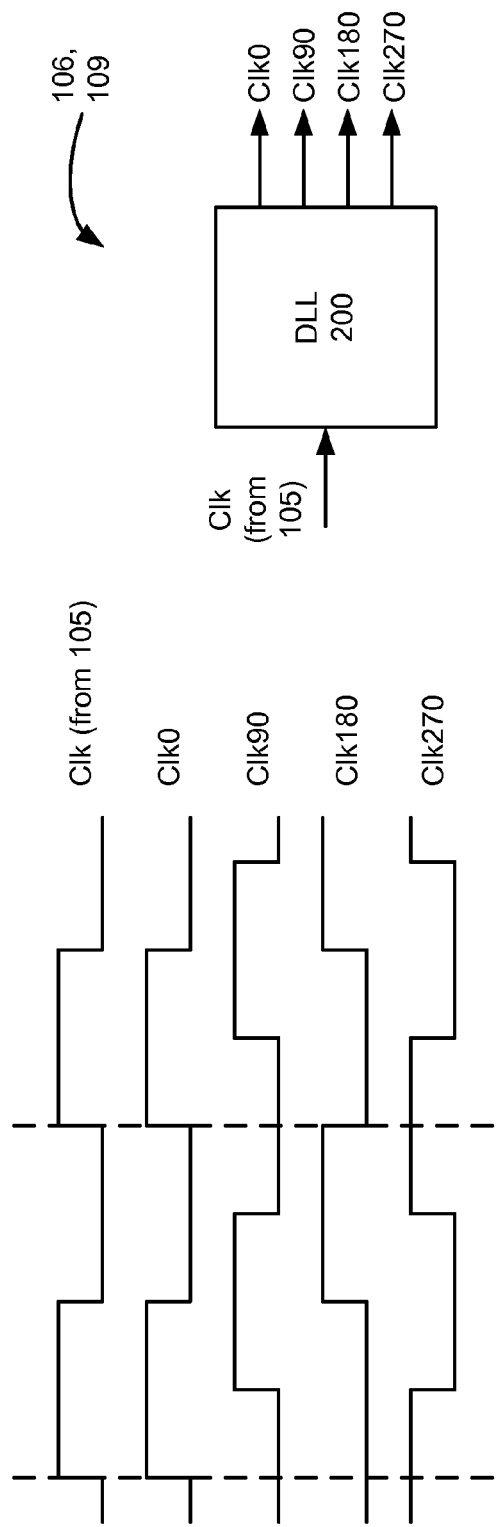
*Figure 5D*
*Figure 5C*

US 7,936,812 B2

FRACTIONAL-RATE DECISION FEEDBACK EQUALIZATION USEFUL IN A DATA TRANSMISSION SYSTEM

FIELD OF THE INVENTION

Embodiments of this invention relate to decision feedback equalization circuitry useable in a data transmission system, such as one employing a Synchronous Dynamic Random Access Memory (SDRAM).

BACKGROUND

Circuit designers of multi-Gigabit systems face a number of challenges as advances in technology mandate increased performance in high-speed systems. For example, chip-to-chip data transfer rates have traditionally been constrained by the bandwidth of the input/output (IO) circuitry in the transmitting and receiving components. However, innovations in IO circuitry have shifted designers' attention from circuit-based limitations to the bandwidth-limiting characteristics of the transmission channel.

At a basic level, data transmission between functional blocks within a single semiconductor device or between multiple components on a printed circuit board may be represented by the system 100 shown in FIG. 1. In FIG. 1, a transmitter 102 (e.g., a microprocessor) sends data over a data channel 104 (e.g., a copper trace on a printed circuit board) to a receiver 106 (e.g., another processor or memory). Because in many synchronous systems it will be necessary to synchronize the data at the receiver, the transmitter may also send a clock signal over its own clock channel 105. Such an arrangement is particularly useful when the receiver 106 comprises a Synchronous Dynamic Random Access Memory (SDRAM), in which case there will typically be a plurality of data channels 104 corresponding to a byte or word of data.

When data is sent from an ideal transmitter 102 to a receiver 106 across an ideal (lossless) channel 104, all of the energy in the transmitted pulse will be contained within a single time cell, which is an example of what is referred to hereinafter as a unit interval (UI). However, real transmitters and real transmission channels do not exhibit ideal characteristics, and in many high-speed circuit designs, the transfer functions of the channels should also be considered. Due to a number of factors, including, for example, the dielectric medium of the printed circuit board, discontinuities introduced by vias, lossiness of the channel 104 at higher frequencies, non-uniform group delay or non-linear phase response of the channel, etc., the initially well-defined digital pulse sent over such a channel 104 will tend to spread or disperse as it passes over the transmission path. This is shown in the simulation of FIG. 2A.

In FIG. 2A, two ideal pulses, $\pi1$ and $\pi2$, each occupy their own adjacent unit intervals (UI3 and UI4). The resulting dispersed pulses, $P_1$ and $P_2$, represent simulated received versions of the ideal pulses after transmission at 10 Gb/s through a 6-inch copper trace in a standard printed circuit board material (FR4). As shown, the majority of $P_1$ is received by the receiver 106 during UI3. However, because of the effect of the channel 104, this data pulse $P_1$ spreads over multiple UIs at the receiver 106. In other words, some portion of the energy of the pulse is observed outside of the UI in which the pulse was sent (e.g., in UI3). This residual energy outside of the UI of interest may perturb another pulse otherwise occupying either of the neighboring UIs, in a phenomenon referred to as intersymbol interference (ISI). The dispersion in each of the pulses $P_1$ and $P_2$ overlaps the other pulse, as shown by the hatched portions in the drawings, which represent ISI.

FIG. 2B illustrates the effects of ISI on an un-encoded (NRZ signal), and particularly shows the problem of DC creep resulting from ISI. Shown is an ideal signal 20 as would be sent from the transmitter 102. The transmission of this ideal signal 20 was simulated as passing through a channel (e.g., 104) with a specified transfer function essentially mimicking that of a lossy and bandwidth-limited trace on a typical printed circuit board. Because frequency components within the ideal signal 20 are approaching the frequency limit of the channel 104, it can be seen that the resulting signal 22 is "smeared" and does not well represent the ideal signal 20. Obviously, such a poor representation of the data reduces the sensing margins at the receiver 106.

DC creep makes sensing further difficult. As one skilled in the art understands, DC creep tends to draw ISI-affected signals higher or lower in potential over time. Whether the average signal level creeps up or down depends on the predominant logic states within the signal: if the signal contains a predominant number of '0s,' the average signal level will creep downward; and if the signal contains a predominant number of '1s,' the average signal level will creep upward. Creep in both directions is noticeable in FIG. 2B. Because the first half of the ideal signal 20 contains mostly '0s,' the resulting signal 22 during that period tends to creep to lower DC levels. By contrast, the second half of the ideal signal 20 contains mostly '1s,' and so it is seen that the resulting signal 22 creeps towards higher DC levels. As noted, this problem of creep further complicates sensing. If it is assumed that a single reference voltage ($V_{REF}$) is used to sense the data at the receiver, creep will eventually cause some '1s' to be erroneously sensed as '0s' (see, e.g., points 24a), and some '0s' to be erroneously sensed as '1s' (see, e.g., point 24b).

Because ISI can give rise to sensing errors at the receiver 106, a number of solutions have been proposed to offset or compensate for the effects of ISI. For example, an equalizer may be employed at transmitter 102 or at receiver 106 to compensate for the anticipated effects of the channel 104. Such an equalizer, which may comprise a filter, attempts to condition the received input signal such that the effect of the channel 104 is removed. One skilled in the art will appreciate that the terms "filter," "equalizer," "equalization filter," etc., may be used interchangeably in this regard. The transfer function of an ideal equalizer is the inverse of the transfer function of the channel 104, and a practical equalizer attempts to recreate this inverse frequency response. Thus, an equalizer attempts to compensate for the frequency and phase response of the channel to produce an overall frequency response that is as flat as possible over the bandwidth of the data being transmitted or a bandwidth of interest, i.e., to normalize the frequency response and minimize group delay variation or the non-linear phase response.

One practical ISI-mitigating technique includes the use of decision feedback equalization (DFE) circuitry at the receiver 106. In DFE, past sensing decisions are used to improve the reliability of future sensing decisions by off-setting either the input signal or the reference voltage to which the input signal is compared. FIG. 3A shows a DFE circuit 108 in receiver 106, and FIG. 3B illustrates the operation of the DFE circuit 108 with reference to an example waveform 30 of received data. One skilled in the art will appreciate that the DFE circuit 108 shown in FIG. 3A incorporates the concept of loop unrolling, in which a critical path is eliminated by using two comparators 110a, 110b to present outputs to multiplexer 112 based on the last detected bit being either a '0' or a '1'.

Specifically, the DFE circuit 108 in FIG. 3A comprises comparators 110a and 110b (typically operational amplifiers or sense amplifiers), a multiplexer (mux) 112, and a flip-flop 114. An input data signal $D_{IN}$ 30 (from, e.g., the channel 104) is received by the DFE circuit 108 and is input to the comparators 110a and 110b. The input data signal $D_{IN}$ 30 is compared to two offset reference voltages at the comparators 110a and 110b. In the first comparator 110a, $D_{IN}$ 30 is compared to a reference voltage $V_{REF}+\alpha$, while in the second comparator 110b, $D_{IN}$ 30 is compared to a reference voltage $V_{REF}-\alpha$, where $\alpha$ is an offset (e.g., 0.05V) from a midpoint reference voltage $V_{REF}$ (e.g., 0.5V). Voltage values for $V_{REF}$ (and $V_{REF}+\alpha$ and $V_{REF}-\alpha$) may be provided by a band gap reference, by a Digital-to-Analog converter (DAC), or by a simple resistor-based voltage divider network. The outputs of the comparators 110a and 110b serve as inputs to the mux 112, which outputs a decision to the flip-flop 114 where it is captured. The output of the flip-flop 114 serves as a control signal of the mux 112, and also as the output $D_{OUT}$ of the DFE circuit 108, which is sent to other circuitry in the receiver circuit 106.

Operation of the DFE circuit 108 can be explained with reference to the example waveform 30 of FIG. 3B. The waveform as transmitted comprises the string of bits '11010,' which because of ISI has become greatly dispersed as received at the DFE circuit's input. The clock signal used to sample the data is superimposed on the waveform 30 to better highlight sampled points 32a-e. Notice that absent the use of the DFE circuit 108, at least one of the sampled data points of the waveform, 32c, a logic '0' bit, would have been erroneously sampled as a logic '1' because its value exceeds an otherwise midpoint reference voltage, $V_{REF}$. However, data point 32c is correctly sampled when the DFE circuit 108 operates. Note that the preceding data point, 32b, comprises a logic '1.' This value is latched by the flip-flop 114, and this logic state chooses the upper input to the mux 112, i.e., the output of comparator 110a. Notice that comparator 110a has an increased reference voltage ($V_{REF}+\alpha$). This increased reference value makes it more likely that the next data point (32c) will be sampled as a logic '0,' which is desired because ISI and DC creep would otherwise tend to increase subsequent data bits toward a logic '1.' When comparator 110a is chosen, data point 32c is compared to $V_{REF}+\alpha$, and because data point 32c is lower than this reference, it is correctly sensed as a logic '0.' Because 32c is correctly sensed as a logic '0,' the feedback loop in the DFE circuit 108 will now choose comparator 110b as the comparator to be used in sensing the next data point 32d. Because comparator 110b has a decreased reference voltage ($V_{REF}-\alpha$), the next data point 32d is more likely to be sensed as a logic '1,' thus countering the tendency of previous data point 32c (logic '0') to draw future bits to a lower voltage level, etc.

In synchronous data transfer systems such as that depicted in FIG. 1, it is becoming preferable to transmit the data (on data channel 104) with a clock (on clock channel 105) having a lower frequency than that of the data. This is beneficial for a number of reasons: first, a lower frequency clock reduces the amount of power necessary for clock generation at the transmitter 102; second, a lower frequency clock is less attenuated by high-frequency channel loss; and third, a lower frequency clock is less likely to accumulate significant jitter.

Unfortunately, a fractional-rate clock, such as a half-rate clock having one-half the frequency (relative to the data rate), does not work with the DFE circuit 108 of FIG. 3A for the obvious reason that the frequency of the clock does not match the frequency of the data. Therefore, in instances where a fractional-rate clock (on clock channel 105) is transmitted with full-rate data (on data channel 104), the DFE circuit 108 will not operate without modification. This disclosure proposes such a useful modification to allow for DFE equalization with a fractional-rate clock.

BRIEF DESCRIPTION OF THE DRAWINGS

FIG. 5B shows a timing diagram of a data signal and a clock signal used in the decision feedback equalizer of FIG. 5A.

FIG. 5C shows clock signals used in the decision feedback equalizer of FIG. 5A.

FIG. 5D shows a DLL used in the decision feedback equalizer of FIG. 5A.

DETAILED DESCRIPTION

Decision feedback equalization (DFE) circuits are disclosed, such as those for compensating for or mitigating ISI and/or DC creep in a received data signal transmitted across a communication channel with a fractional-rate clock (i.e., a clock of a lesser frequency than that of the data signal). For example, a one-half-rate clocked DFE circuit utilizes a first and a second input data path, which are respectively activated on rising and falling edges of an associated half-rate clock, allowing even numbered data bits to be sampled by one data path and odd numbered data bits to be sampled by the other data path. Each of the input data paths has a pair of comparison devices with differing reference voltage levels. The comparison devices in each input data path output to a multiplexer to pick a given comparison device's output depending on the logic level of the previously received bit. The output of each data path is sent as a control input to the multiplexer of the other data path. Thus, the results from previously-received bits are used to affect which comparison device's output is passed to the output of the circuit, even though the synchronizing clock is at half the rate of the data. In a quarter-rate implementation, the quarter-rate clock is used to form four clock pulses for sequentially clocking data through four input data paths, and otherwise operates essentially similarly to the half-rate implementation just summarized. The quarter-rate implementation can also use two clocks utilizing both edges, with comparisons triggered on both the rising and falling edges.

Figure 1:
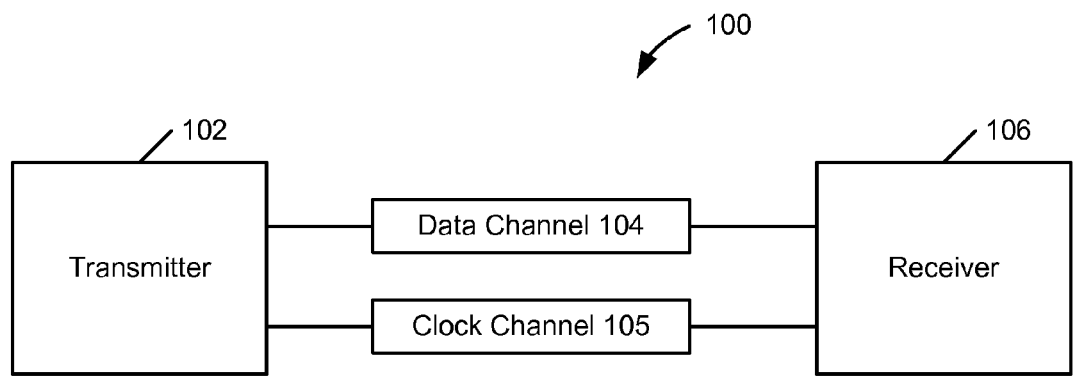
FIG. 1 shows a block diagram of at least one data channel and a clock channel between a transmitter and a receiver in a synchronous data transfer system.
Figure 2A:
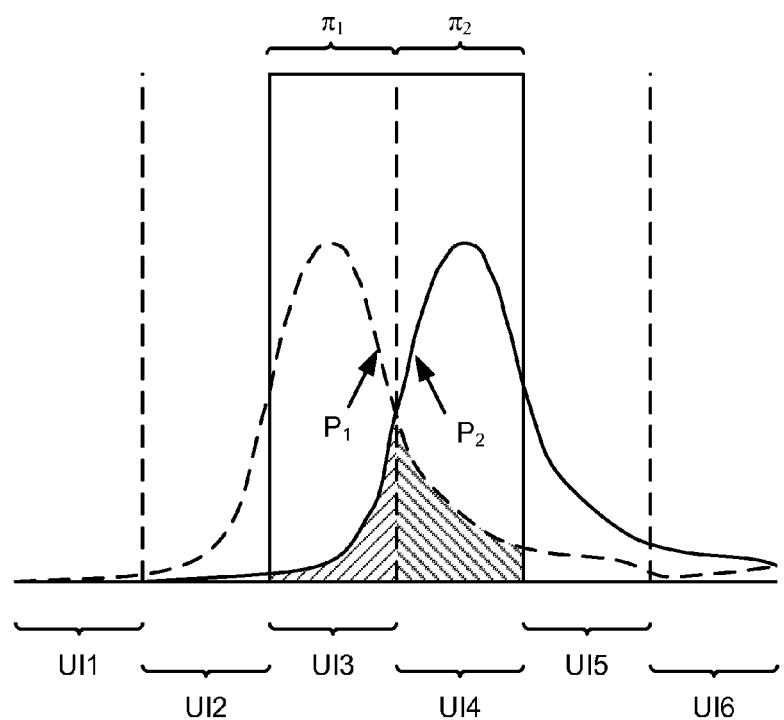
FIGS. 2A and 2B show the effect of a transmission channel on pulses sent across the channel, and in particular show intersymbol interference (ISI).
Figure 2B:
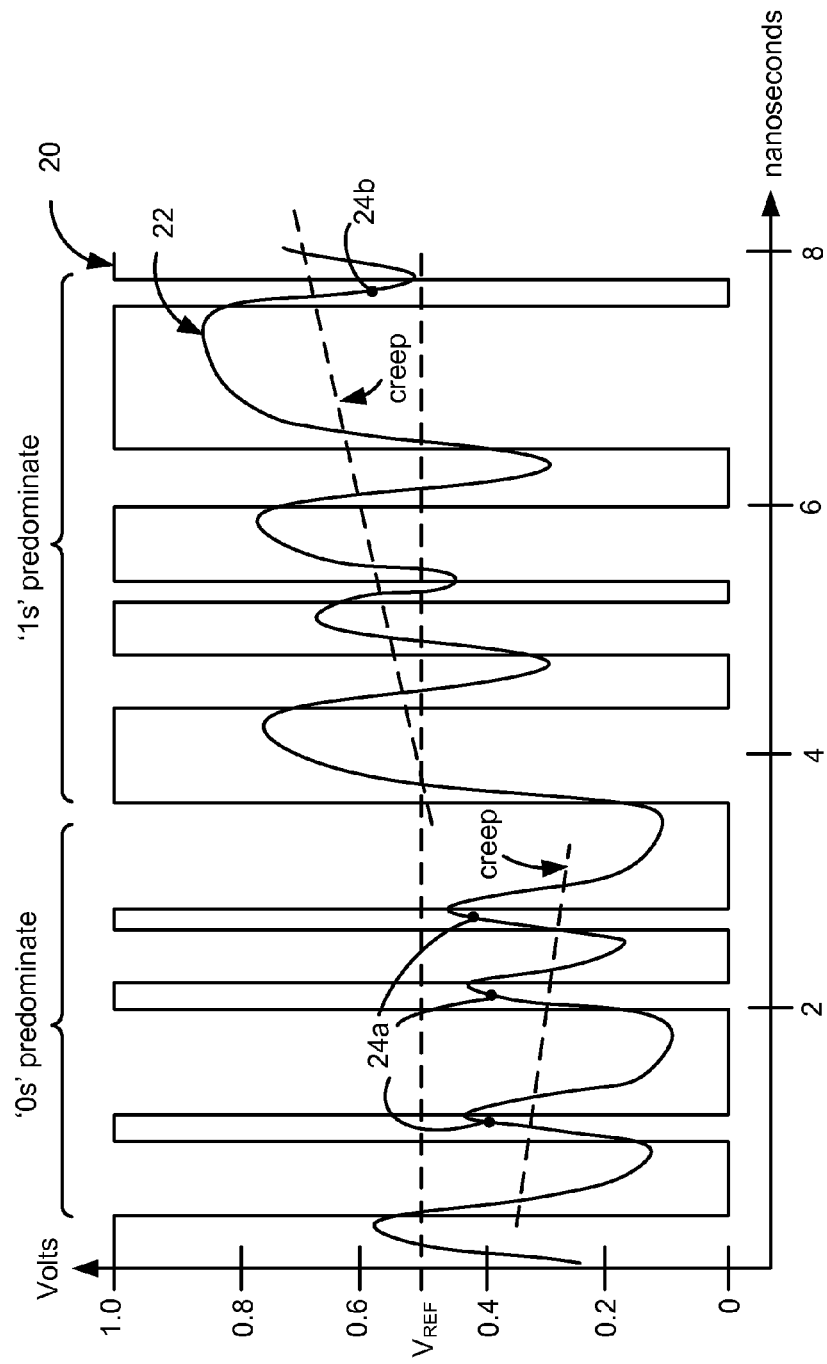
Figure 3A:
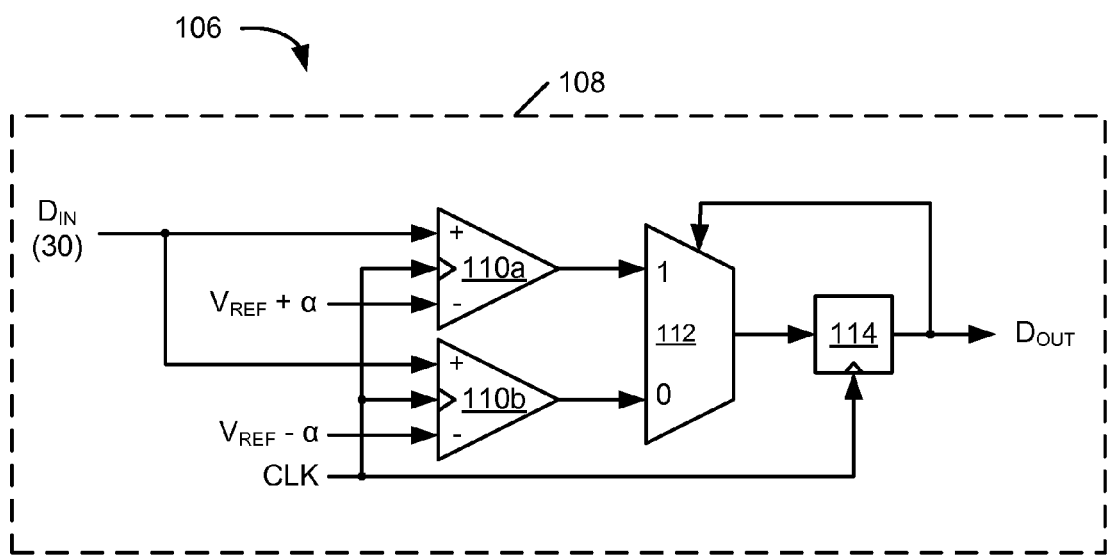
FIG. 3A shows a decision feedback equalizer according to the prior art.
Figure 3B:
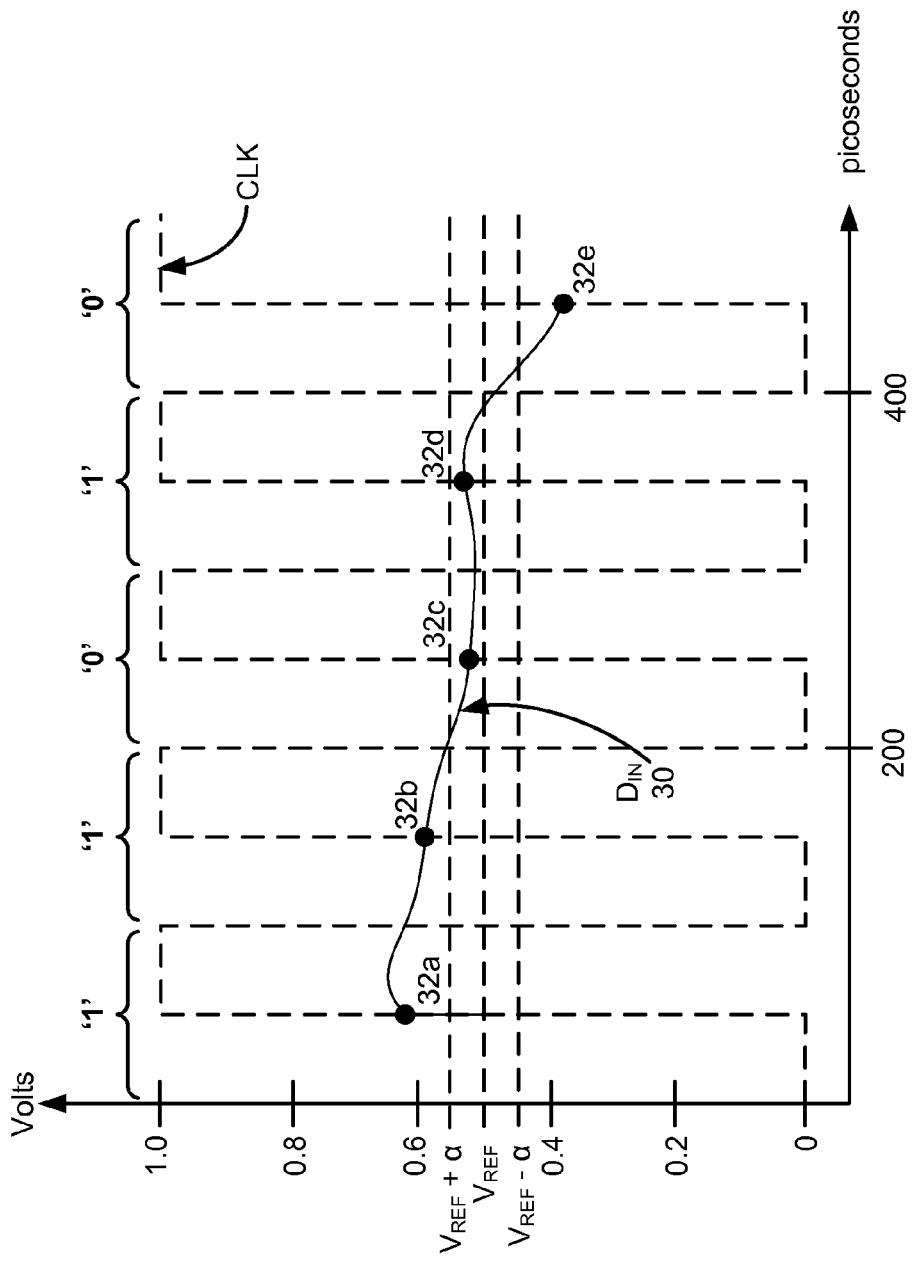
FIG. 3B shows a timing diagram of an example waveform used in the decision feedback equalizer of FIG. 3A.
Figure 4A:
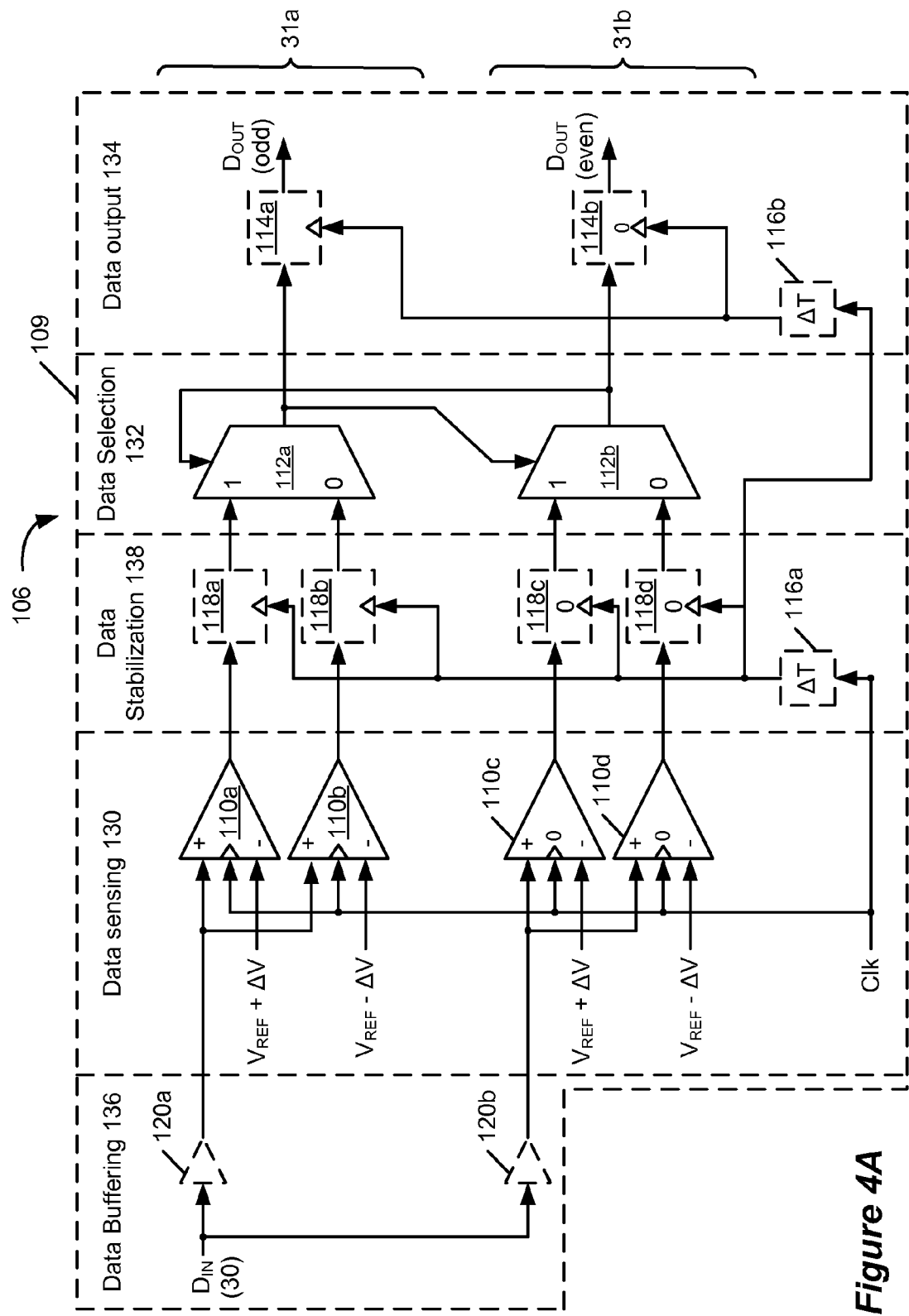
FIG. 4A shows a half-rate clock decision feedback equalizer in accordance with an embodiment of the invention.

FIG. 4A shows a DFE circuit 109 in the receiver 106 according to one embodiment of the invention that is operable with a half-rate clock, i.e., a synchronizing clock transmitted with the data or generated locally with a frequency of one-half that of the data rate. Said another way, the sampling clock has a clock period (T) twice the duration (d) of the transmitted data bits, as illustrated in the timing diagram of FIG. 4B. In various embodiments of the invention, such fractional rate clocks, represented generically as having a rate 1/k (half-rate, quarter-rate, etc.), may have a clock period that is a multiple 'k' of the duration of a data bit. The DFE circuit 109 comprises a data sensing stage 130 and a data selection stage 132. Additionally, the DFE circuit 109 can comprise an optional data buffering stage 136, a data stabilization stage 138, and a data output stage 134, and hence such optional components are shown in dotted lines.

Data ($D_{IN}$ 30) is received from a data channel (e.g., data channel 104), and the half-rate clock signal (Clk) is received from a clock channel (e.g., clock channel 105). However, the improved DFE circuit 109 comprises, in this half-rate clock embodiment, two input data paths 31a and 31b each capable of receiving data from the input data signal $D_{IN}$ 30. The input data signal is separated by the two paths 31a and 31b such that odd data bits of the incoming sequence are sampled at comparators 110a-110b on the rising edge of the clock, while even data bits in the sequence are sampled at comparators 110c-110d on the falling edge of the clock. (The comparison devices are shown as comparators including integrated latches, although one skilled in the art will appreciate that a discrete latch may also be used in conjunction with an otherwise standard comparison device). Notice, in this regard, that the clocking input on the comparators 110c and 110d are denoted with a '0,' indicating that those comparators sample the data on the falling edge of the clock.

Figure 4C:
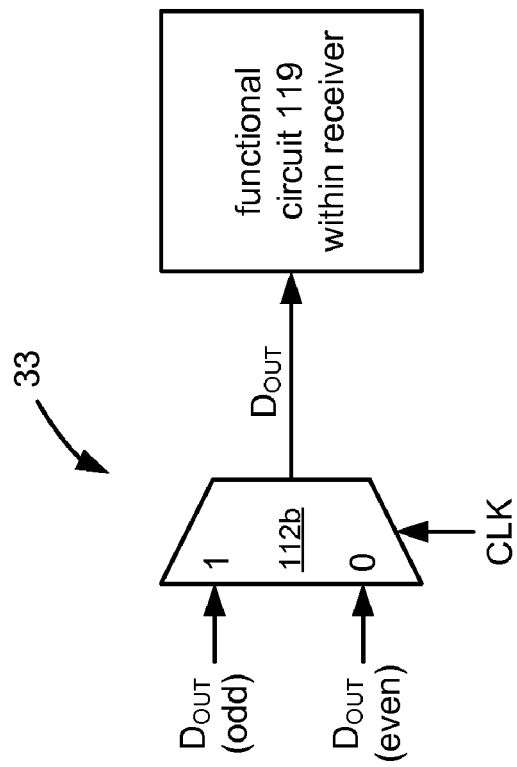
FIG. 4C shows a simple circuit for re-serialization of the parallel data output from the decision feedback equalizer of FIG. 4A.
Figure 4B:
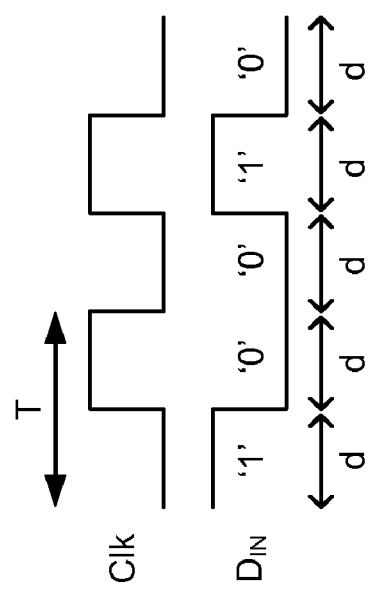
FIG. 4B shows a timing diagram of a data signal and a clock signal used in the decision feedback equalizer of FIG. 4A.

Each of the input paths 31a and 31b has a pair of comparators (110a/110b and 110c/110d), and the output of either comparator in a pair can be chosen by the respective associated mux 112a or 112b. The outputs from the muxes 112a and 112b are sent to flip-flops (e.g., latches) 114a and 114b, which as noted are respectively clocked on the rising and falling edge of the clock. By this clocking scheme, sampled odd data bits in the input data stream are output by flip-flop 114a ($D_{OUT}$(odd)), while sampled even data bits in the input stream are output by flip-flop 114b ($D_{OUT}$(even)). As shown in FIG. 4C, these two outputs $D_{OUT}$(odd) and $D_{OUT}$(even) can be interleaved onto a single output signal line, $D_{OUT}$, by an appropriate re-serialization circuit 33 to reconstitute the originally transmitted data stream of bits. This single output signal line $D_{OUT}$ then is put to use within a functional circuit 119 within the receiver 106. However, such re-serialization of the data using the re-serialization circuit 33 is not strictly necessary, particularly if data is parallelized within the receiver so that (in an SDRAM application for example) the logic and array can operate at a lower frequency.

Returning to the operation of the improved DFE circuit 109, notice that for a given half clock cycle, each mux 112a, 112b receives two comparator outputs, which are the results of comparisons of a bit of the input data signal $D_{IN}$ 30 with $V_{REF}+\Delta V$ and $V_{REF}-\Delta V$. Each mux 112a, 112b selects one of these inputs based on the decision of the other mux from the previous half clock cycle, and so each mux receives the output from the other mux as a control input. For example, if the previous decision (i.e., the output value) of mux 112b was a logic '1,' this value is passed to the control input of mux 112a, which will choose to pass the output of the comparator 110a. As explained in the background section, such a selection is a sensible way to mitigate against the effects of ISI and DC creep. This is because the reference voltage used with comparator 110a is higher ($V_{REF}+\Delta V$), making it more likely that the comparator 110a will determine that the next logic state is a '0,' which counters the affects of ISI and DC creep. On the other hand, if the previous binary decision output by mux 112b was a logic '0,' the bottom input from comparator 110b (with its reduced reference voltage $V_{REF}-\Delta V$) would be chosen. In other words, the output from the data path of the current bit influences the sensing of the next data bit by favoring the sensing of the complement (i.e., inverse) logic state. While this approach is appropriate for single-tap DFE circuits (when only one past decision is known), when multiple taps are used to further refine the equalization (as will be discussed later), the more general technique of maximizing the sensing margin may not coincide with simply biasing the sensing circuitry toward sensing the complement logic state as just mentioned.

One skilled in the art will appreciate that numerous modifications of the above-discussed DFE circuit 109 are possible. For example, as shown in FIG. 4A, input buffers 120a and 120b, in an optional data buffering stage 136, may be included before the comparators 110a-110d, such as to reduce input capacitance and/or kickback noise. Further, flip-flops (e.g., latches) 118a-118d, in an optional data stabilization stage 138, may be added to each comparator 110a-110d output. The stabilization provided by the flip-flops 118a-118d can be used to compensate for the latency variability of the comparators 110a-110d. In one or more embodiments, flip-flops 114a, 114b and 118a-118d are delayed slightly by delay elements 116a, 116b, such as to ensure that data propagates through each of the input data paths 31a and 31b without ambiguity or conflict.

Figure 5A:
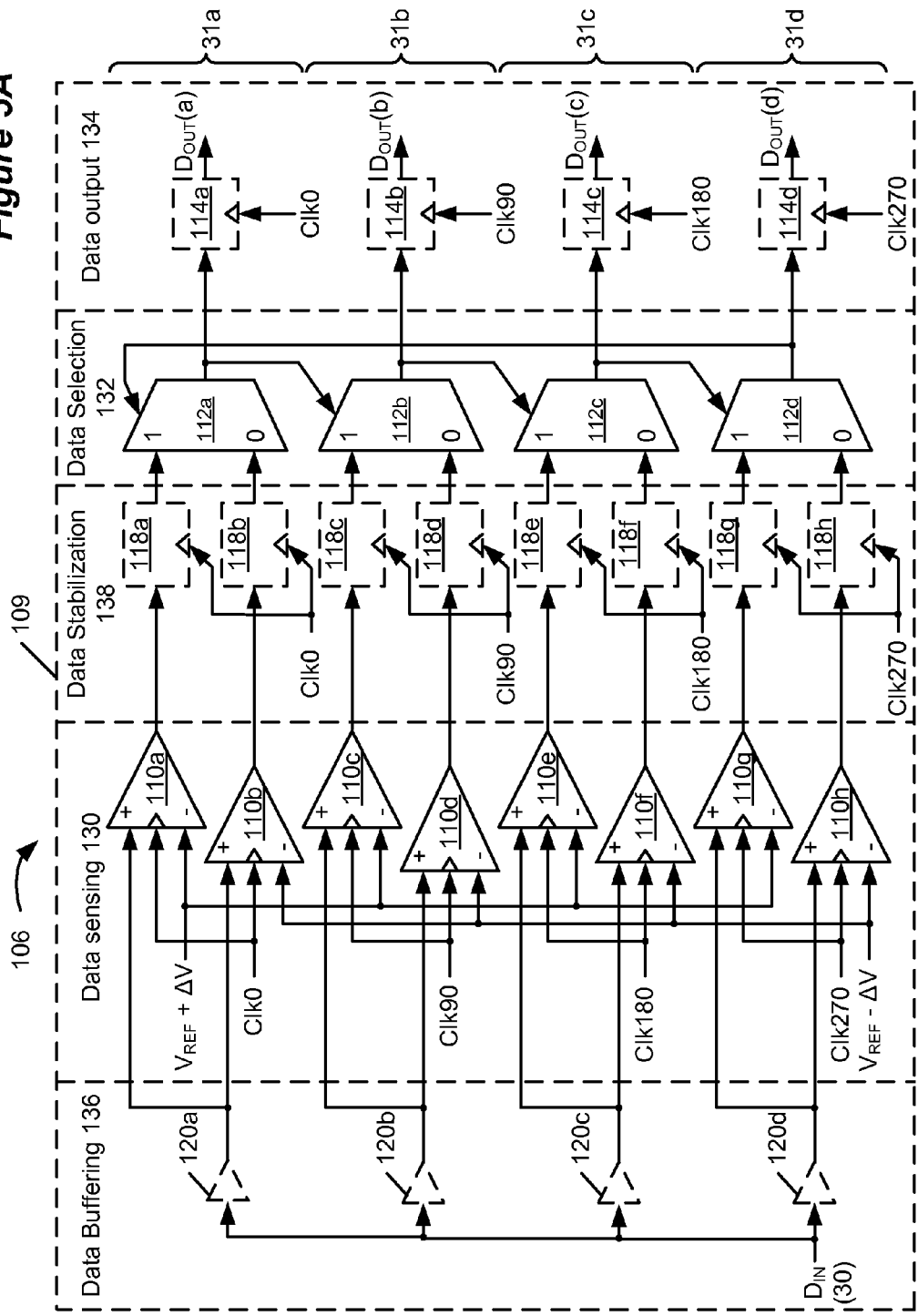
FIG. 5A shows a quarter-rate clock decision feedback equalizer in accordance with an embodiment of the invention.

While FIG. 4A shows an embodiment using a half-rate clock, the improved DFE circuit 109 can be improved to accommodate even slower clocks. For example, FIG. 5A shows a DFE circuit 109 in the receiver 106 employing a one-quarter rate clocking scheme, i.e., a synchronizing clock transmitted along with the data or generated locally at a frequency of one-quarter that of the data. Said another way, the clock has a period (T) of four times the duration (d) of a data bit, as shown in FIG. 5B. The DFE circuit 109 comprises four data paths 31a-31d, and the same stages 130, 132, 134, 136, and 138 discussed above. Discussion of similar elements in FIG. 5A will not be repeated.

In the quarter-rate configuration, each pair of comparators (e.g., 110a and 110b) receives the input data signal $D_{IN}$ 30 from a data channel (e.g., data channel 104), and a reference voltage ($V_{REF}+\Delta V$ or $V_{REF}-\Delta V$). However, because more than two input data paths 31 are present, each data path cannot simply be controlled by the rising and falling edge of the transmitted clock as was the case with the half-rate clocking scheme of FIG. 4A. Instead, in the quarter-rate scheme disclosed in FIG. 5A, four distinct clocks are used, Clk0, Clk90, Clk180, and Clk270. As illustrated in FIG. 5C, these four clock signals comprise pulses each occupying a different portion of the input clock period, T. Thus, Clk0 comprises a pulse from 0 to 180 degrees within the input clock period; Clk90 comprises a pulse from 90 to 270 degrees within the input clock period, etc. These four clock signals Clk0, Clk90, Clk180, and Clk270 can be generated at the receiver 106 (and perhaps within the DFE circuit 109 itself) using the transmitted quarter-rate clock as received from the clock channel 105, such as is shown in FIG. 5D. The generation of the four clock signals can comprise the use of a Delay Locked Loop (DLL) 200 or a Phase Locked Loop (PLL) for example.

The functionality of the DFE circuit 109 employing the quarter-rate clocking scheme is essentially the same as the half-rate version discussed above. However, each of the four data paths 31a-d samples the data on successive quarter cycles of the clock using the generated clock signals Clk0, Clk90, Clk180, and Clk270. Thus, a first data bit is sampled by Clk0 in path 31a, a second data bit is sampled by Clk90 in path 31b, a third by Clk180 in path 31c, a fourth by CLK270 in path 31d, and so on such that the fifth consecutive bit is once again sampled by Clk0 in path 31a, etc. Thus, in general terms, each data path 31a-d receives every fourth data bit from the data input signal $D_{IN}$ 30, processes the data bit based on the last binary decision, and outputs a data value $D_{OUT}$(a)-(d). The result is that in addition to avoiding problems associates with feeding back the past bits in time, each comparator is allowed to resolve over n unit intervals (UIs) for a 1/n-rate clock.

The decision of each mux 112a-112d is triggered by the mux output from the previous quarter-cycle of the clock. As an illustrative example, the decision made by the mux 112b, that is in the second data path 31b (clocked on Clk90), is triggered by the output of the mux 112a, that is in the first data path (clocked on Clk0). As with the half-rate embodiment, this scheme mitigates ISI for the reasons discussed above.

Like the half-rate circuit discussed above with reference to FIG. 4A, one skilled in the art will appreciate that numerous modifications to the quarter-rate DFE circuit 109 are possible, such as the optional use of input buffers 120a-120d and flip-flops 118a-118h and 114a-d. As discussed above, it may be beneficial to time delay the various clock signals provided to the flip-flops 114a-d and 118a-h. This was discussed with reference to FIG. 4A and such delay elements are not shown in FIG. 5A for convenience.

As shown in FIG. 5A, all elements within each of the data paths 31a-d are clocked on one of the four clock signals, which as just mentioned can be slightly delayed, such as to ensure reliable data propagation through the data paths. However, should it be desirable to operate the circuit without delay elements, other clocking schemes can be used as well that promote reliable operation. For example, a clocking scheme similar to the embodiment shown in FIG. 4A may also be used. To achieve quarter-rate clocking, two offset clock signals may be used, and components in a given data path 31a-d in the DFE circuit 109 may be clocked on a rising edge or a falling edge of one of the clock signals, similar the components shown in FIG. 4A. As this clocking scheme was discussed with reference to FIG. 4A, such a clocking scheme is not shown for the quarter-rate DFE circuit 109 for convenience.

Figure 5E:
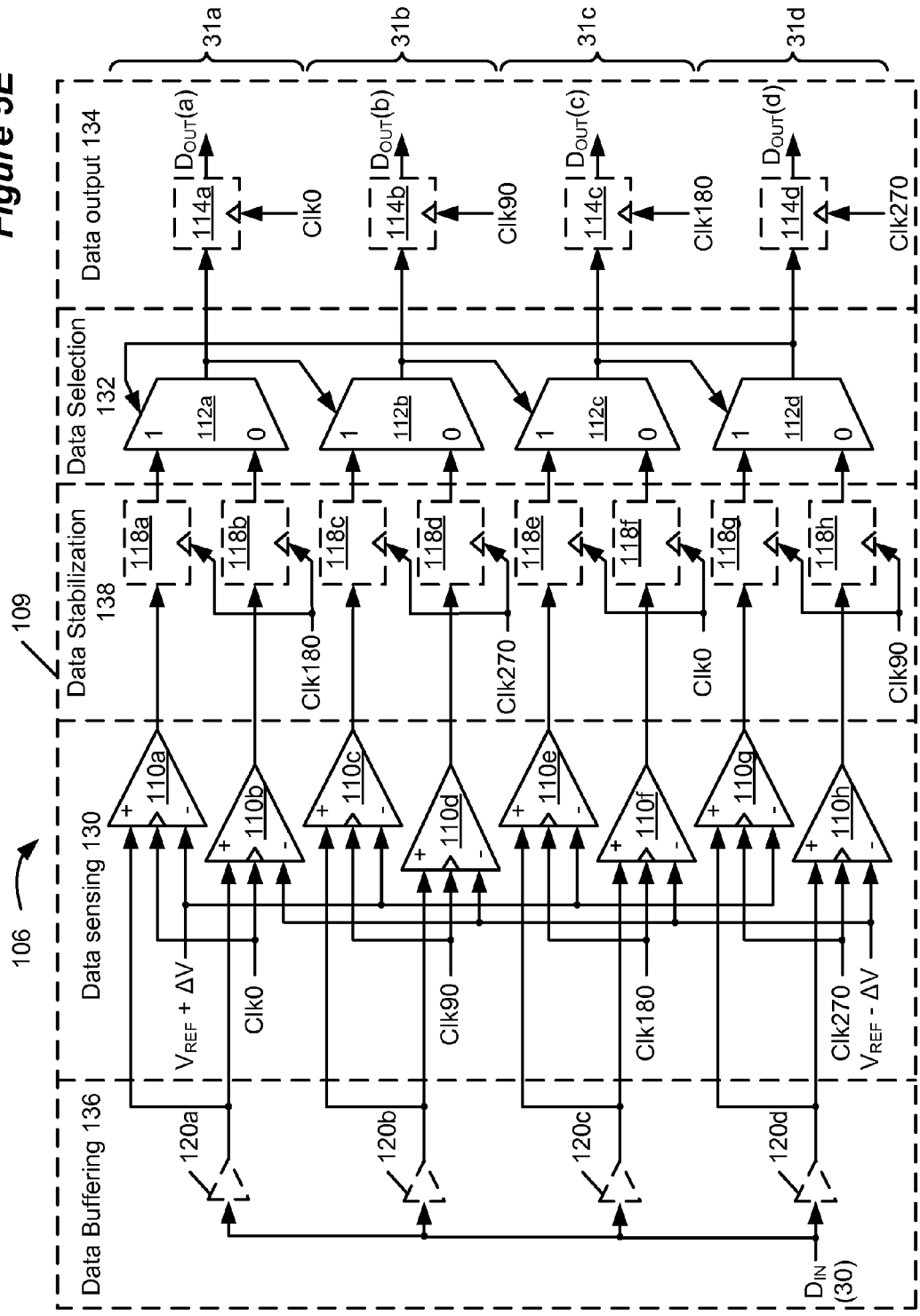
FIG. 5E shows a quarter-rate clock decision feedback equalizer in accordance with an embodiment of the invention.

In FIG. 5E, the clock signal used in the data stabilization stages 138 are 180 degrees out of phase with the clocks used elsewhere in a given data path 31a-d, so that in data path 31a, the comparators 110a and 110b are triggered on Clk0, as is the flip-flop 114a, but the intervening flip-flops 118a and 118b are triggered on Clk180. This can help guarantee that the data proceeds through each data path 31a-d in an orderly fashion, and without the need to generate uniquely-delayed clock phases within each data path 31a-d.

Note that because the disclosed schemes of FIGS. 5A and 5E employ four discrete clock pulses, all of the circuitry is triggered on either the leading edges or falling edges of those clocks. However, other clocking schemes could be employed, and what is illustrated is merely exemplary, keeping in mind that each clocked element in a given data path should probably be logically chosen to provide the best possible timing margin following the latency of the previous clocked elements in the data path.

Figure 5F:
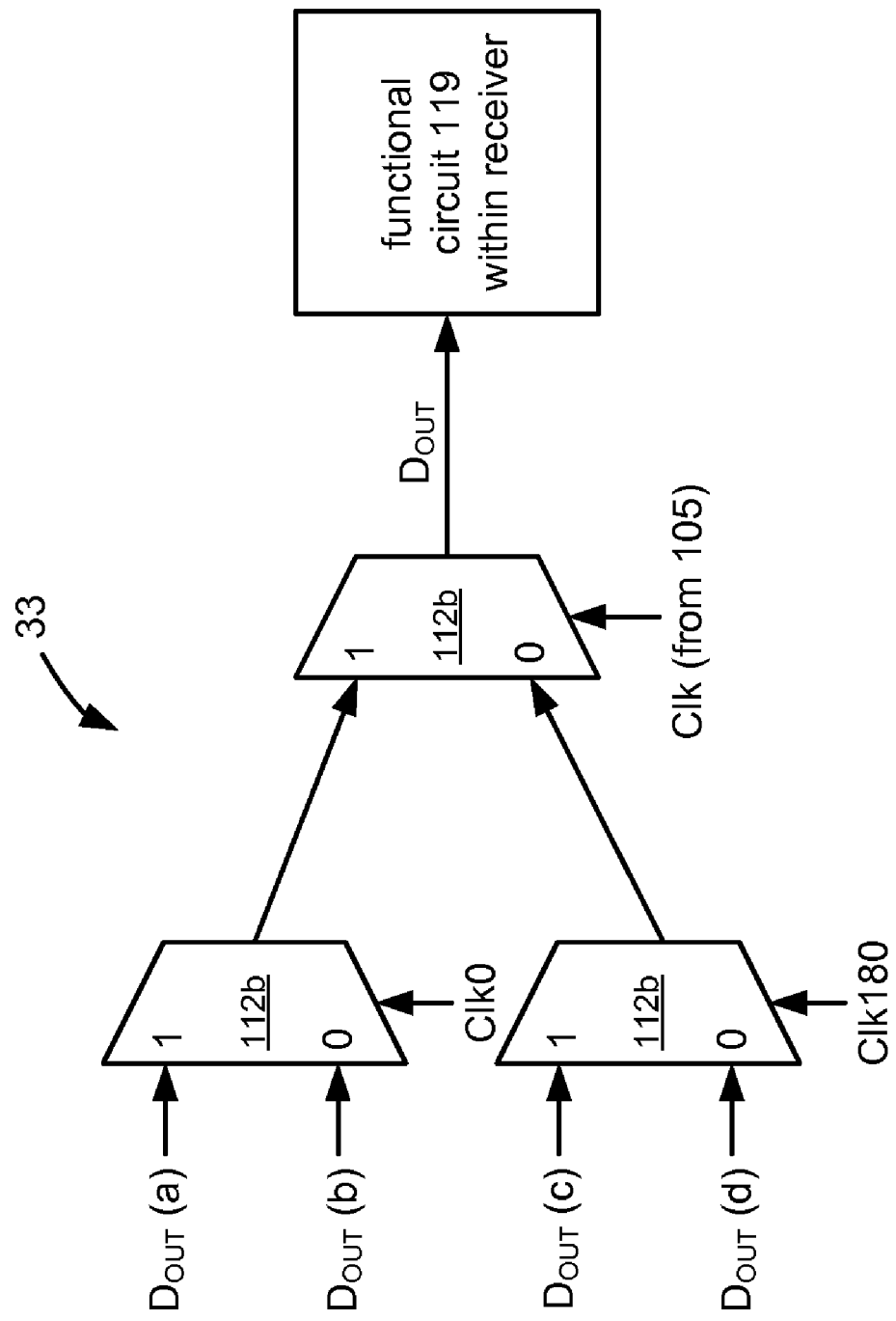
FIG. 5F shows a simple circuit for re-serialization of the parallel data output from the decision feedback equalizers of FIGS. 5A and 5E.

As shown in FIG. 5F, the four data path outputs $D_{OUT}$(a)-(d) can be interleaved onto a single output signal line, $D_{OUT}$, by an appropriate re-serialization circuit 33 to reconstitute the original data bits. This single output signal line $D_{OUT}$ should then represent the transmitted data, which is used by a functional circuit 119 within the receiver 106. However, as discussed above with reference to FIG. 4C, it may be unnecessary to re-serialize the data within the receiver in a given application.

Figure 6:
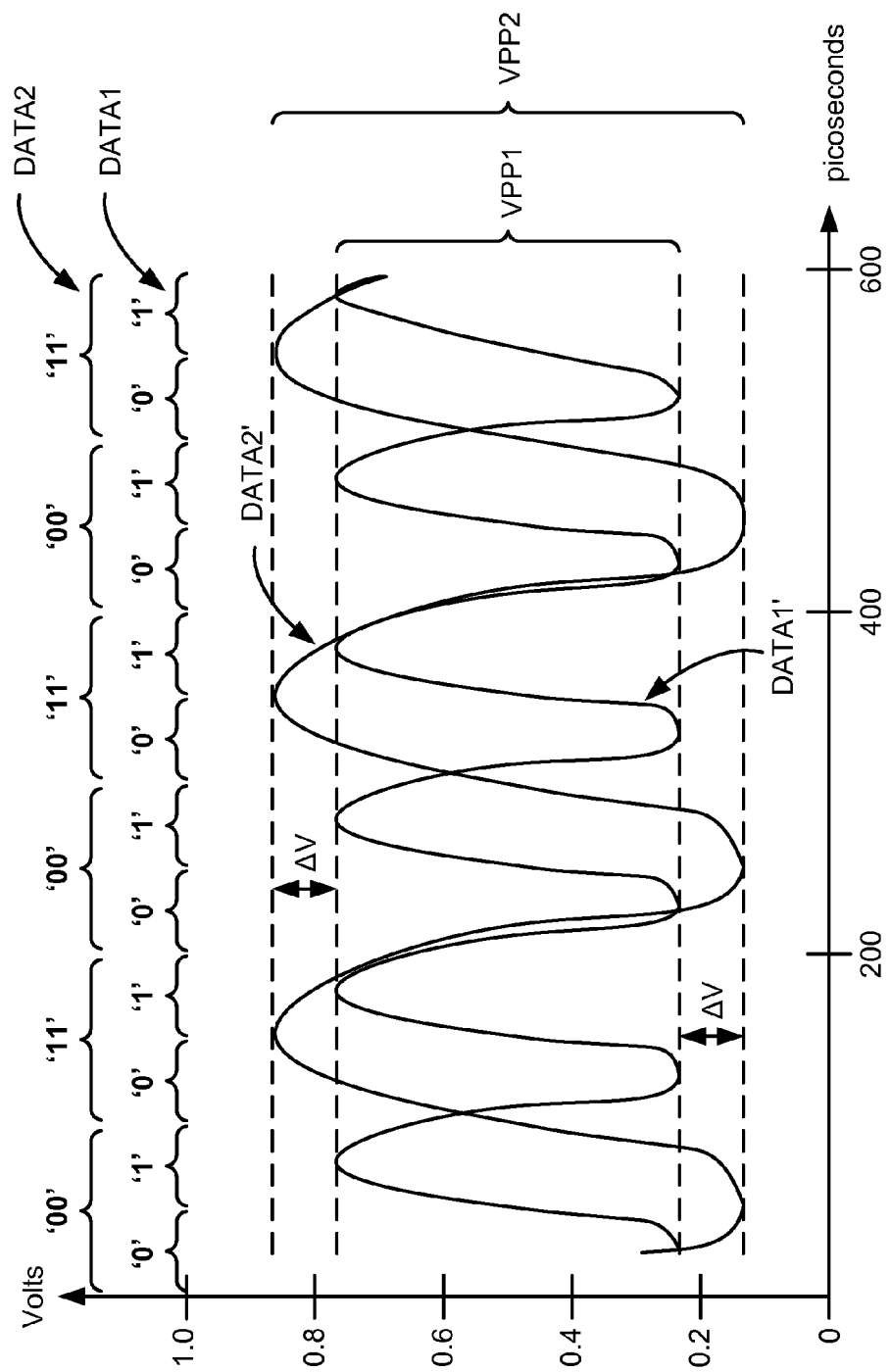
FIG. 6 shows a method for determining an offset value to be used in the comparison devices of a decision feedback equalizer circuit.

As discussed above, each of the comparators in a given path compares the input data bits to two different reference potentials: $V_{REF}+\Delta V$ and $V_{REF}-\Delta V$. In another inventive aspect of this disclosure, the offset value $\Delta V$ used with the comparators can be chosen in accordance with the illustration in FIG. 6. Shown in FIG. 6 are two ideal training signals, DATA1 and DATA2, where DATA1' and DATA2' then comprise either actual data signals received from the data channel 104 in a real application, or simulated versions of the data as transmitted by the data channel 104. The first training signal, DATA1, is of the frequency of normally transmitted data (i.e., full-rate), having a '010101 . . .' pattern. The second training signal, DATA2, is half-rate data having a '001 100110011 . . .' pattern. In other words, DATA1 is transmitted at twice the frequency of DATA2. The corresponding signals DATA1' and DATA2' received by the receiver 106 have different amplitudes due to frequency-dependent attenuation.

The higher-frequency training signal DATA1' has a smaller peak-to-peak voltage (VPP1) than does the second received training signal DATA2' (VPP2), which is expected because a higher frequency periodic signal would be more strongly affected by attenuation. After the training signals have had sufficient time to reach a state of equilibrium, the peak-to-peak voltages of the training signals DATA1' and DATA2' are measured. The resulting difference in peak-to-peak voltages between these two signals (VPP2-VPP1), denoted $2\Delta V$, may be used to calculate the offset reference voltage $\Delta V$ used to set the reference potentials for the comparators in the disclosed DFE circuits. Therefore, the difference in peak-to-peak voltage between the two training signals comprises an adequate estimate of a threshold for separating permissible amounts of ISI from impermissible amounts of ISI. Although disclosed in the context of setting the offset $\Delta V$ in the half-rate and quarter-rate DFE circuits 109 of FIGS. 4A and 5A, this same technique can be used to set offset a in the prior art DFE circuit 108, and hence is inventive within the context of that circuit.

One skilled in the art will appreciate that numerous other modifications of the above-disclosed fractional-rate DFE circuitry are possible. For example, any comparison device, such as a sense amplifier, can be used in place of a comparator. As used in this disclosure, the term "comparison device" refers to a general class of devices used for comparing two or more input signals, and may comprise, for example, a comparator, a sense amplifier, a differential amplifier, etc. Further, although half-rate and quarter-rate clocking schemes are disclosed, the above-disclosed techniques can be extended to other fractional-rate clocking schemes, such as ⅓-rate, ⅕-rate, etc., and other powered fractions such as ⅛-rate, 1/16- rate, etc. Similarly, multiple data sensing stages 130 and data selection stages 132 may be employed with multiple levels of offset values to incorporate feedback from more than one prior mux decision, which would provide additional confidence in each mux decision. In other words, while single-tap DFE circuitry is disclosed herein, in which consideration is given only to the immediately-preceding data sampling decision, the DFE circuitry disclosed herein is readily extendable to multiple-tap solutions in which multiple preceding decisions are used to even further refine the reference voltage used for comparison, such as is discussed with respect to FIG. 8 below.

Further, while a simple approximation is disclosed to determine logical offset values ($\Delta V$) to be used for $V_{REF}$ at the comparators (see FIG. 6), one skilled in the art will appreciate that other methods may be used to determine an optimal value of $\Delta V$. For example, software-based numerical analysis techniques (i.e., simulation with commercial computer software, such as ModelWare, Matlab, or Mathematica) may be used to determine $\Delta V$ based on the simulated channel response. Alternatively, $\Delta V$ may be updated and optimized by successively applying training input data signals to the DFE circuit 109, thereby allowing information to be gathered in the DFE circuit 109 to determine or 'learn' a value for $\Delta V$.

Figure 7:
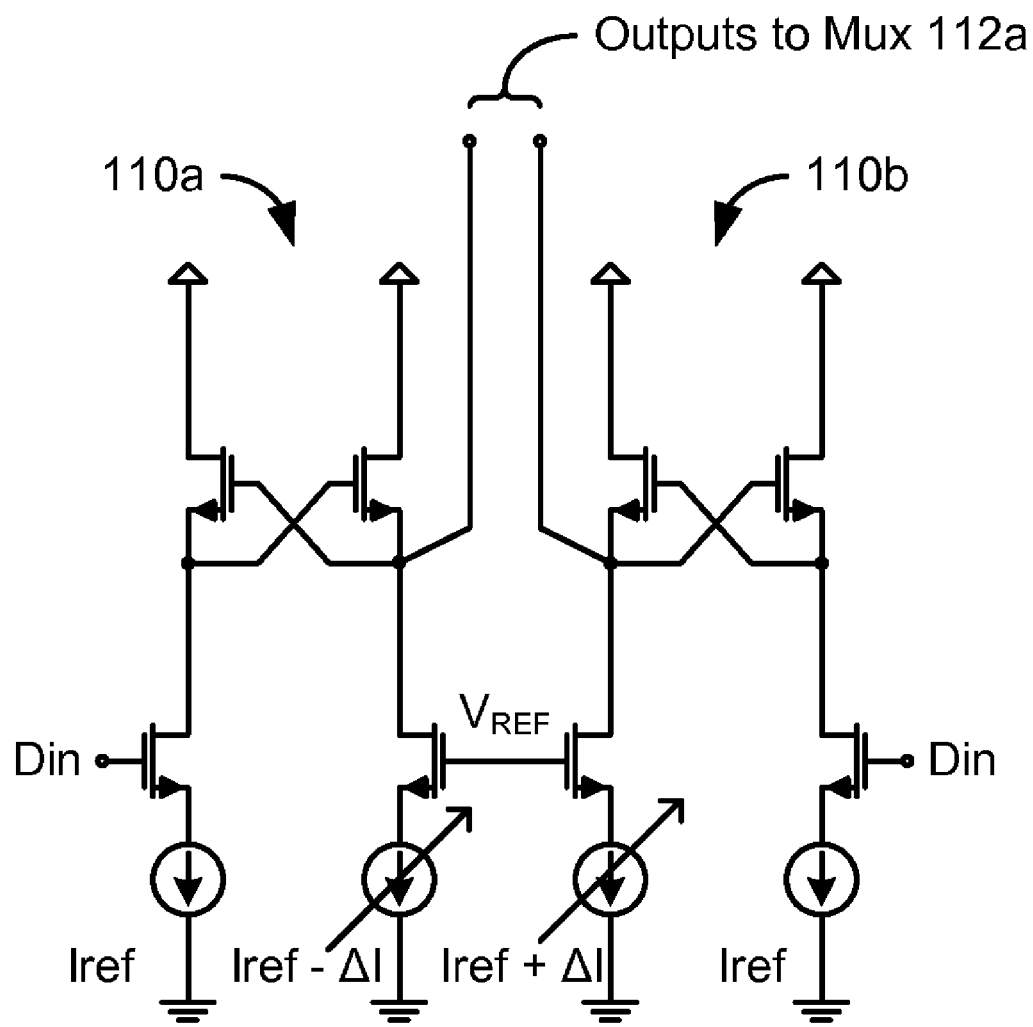
FIG. 7 shows comparison devices using current skewing in accordance with an embodiment of the invention.

Further, once a value for $\Delta V$ is determined, $\Delta V$ may be varied (i.e., adapted or trimmed) by the DFE circuit 109, such as to further enhance the probability of correctly sensing the received data bits, and such modification can take place either upon initialization of or during normal operation of the transmission system. Such a modification includes the possibility of modifying $+\Delta V$ and $-\Delta V$ such that $+\Delta V$ is offset (e.g., skewed) from $V_{REF}$ by a different voltage than $-\Delta V$. In other words, the offset reference voltages may be trained independently. Such skewing could also accommodate for anticipated signal asymmetry. In addition, implementation of $\Delta V$ may in actuality not comprise modification of a voltage input reference at all, but instead may comprise techniques that modify current to effectively work a voltage offset, such as by skewing current through the input stages of each comparator's differential pair. An example of current skewing is shown in FIG. 7. Shown is the internal circuitry for each of the comparators in a given data path, such as comparators 110a and 110b in FIG. 4A. As shown, the comparators 110a and 110b share a single midpoint reference voltage, $V_{REF}$. The comparators also receive an identical bias current through the inner input devices (Iref). However, because the bias current in the outer devices is skewed by a small amount (Iref+$\Delta$I or $I_{REF}$−$\Delta$I), the two comparators, in effect, see the incoming signal with a positive or negative skew in voltage without the need for generating distinct DC voltage levels.

Figure 8:
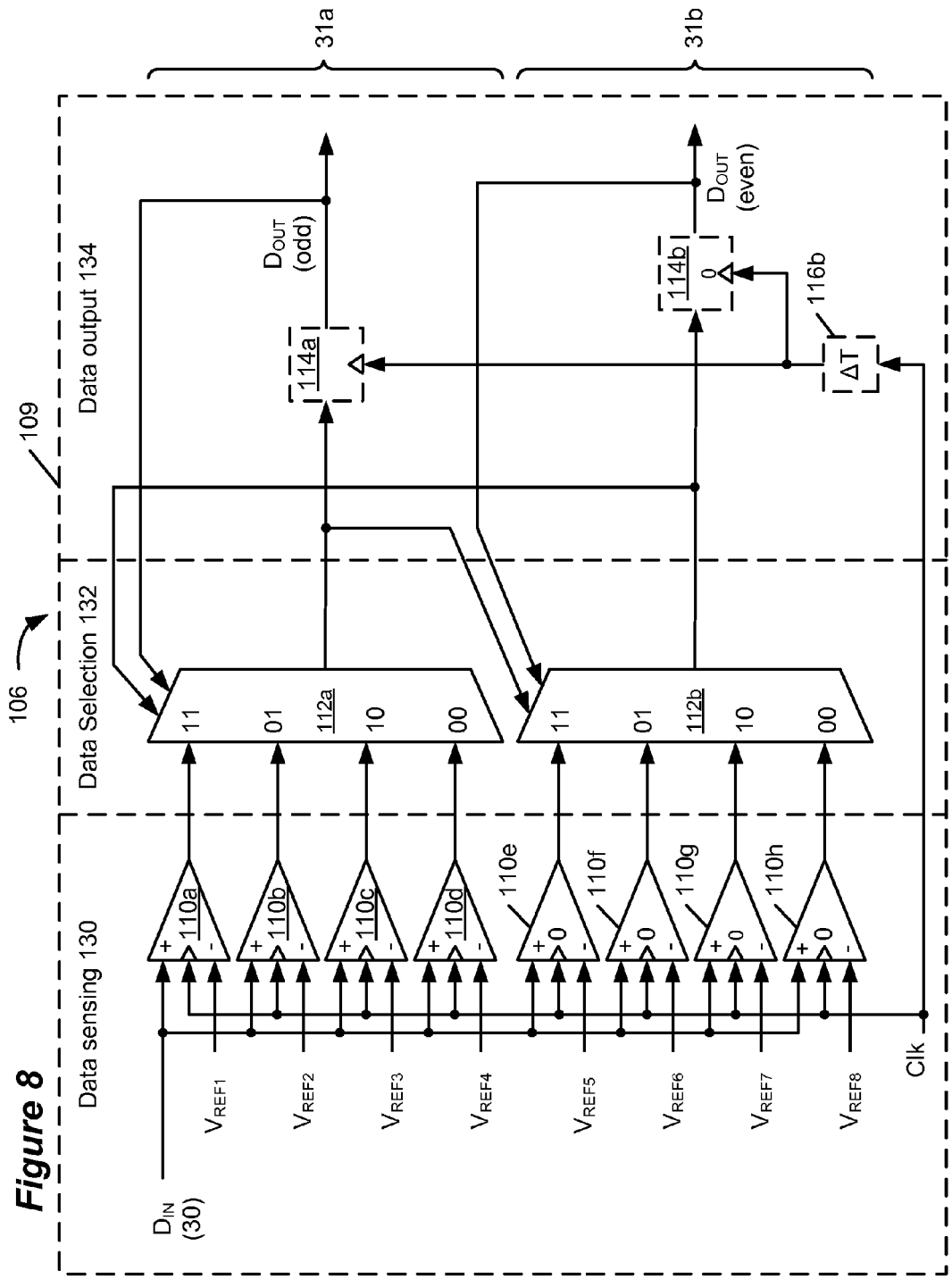
FIG. 8 shows a half-rate clock decision feedback equalizer in accordance with an embodiment of the invention.

As illustrated, the disclosed DFE circuits use only one previous sensing decision to modify the sensing decision for the next subsequent bit. However, and as illustrated in FIG. 8, a plurality of past decisions can be used to influence the sensing decision. Shown is a DFE circuit 109 operable with a half-rate clock, such as was illustrated in FIG. 4A. However, two previous decisions are used to affect the sensing decision of a given bit. Thus, each data path 31a, 31b has two outputs, each of which feedback to a multiplexer in one of the data paths. The feedback paths are arranged to allow for the selection by each multiplexer 112a, 112b of one of four comparators (110a-110d, 110e-110h), with corresponding reference voltages ($V_{REF1}$-$V_{REF4}$, $V_{REF5}$-$V_{REF8}$). Based on the combination of the past two decisions, the mux in the output path outputs the decision made through comparison with the most appropriate of the four reference voltages. Of course, this can be extended to provide for decisions made on any number of previous bits, and the use of two previous bits is shown in FIG. 8 only by way of example. Further, this technique could be extended to any system with fractional clock rates, through modifications similar to those discussed above to enable half-rate and quarter-rate single-tap equalization.

Figure 9:
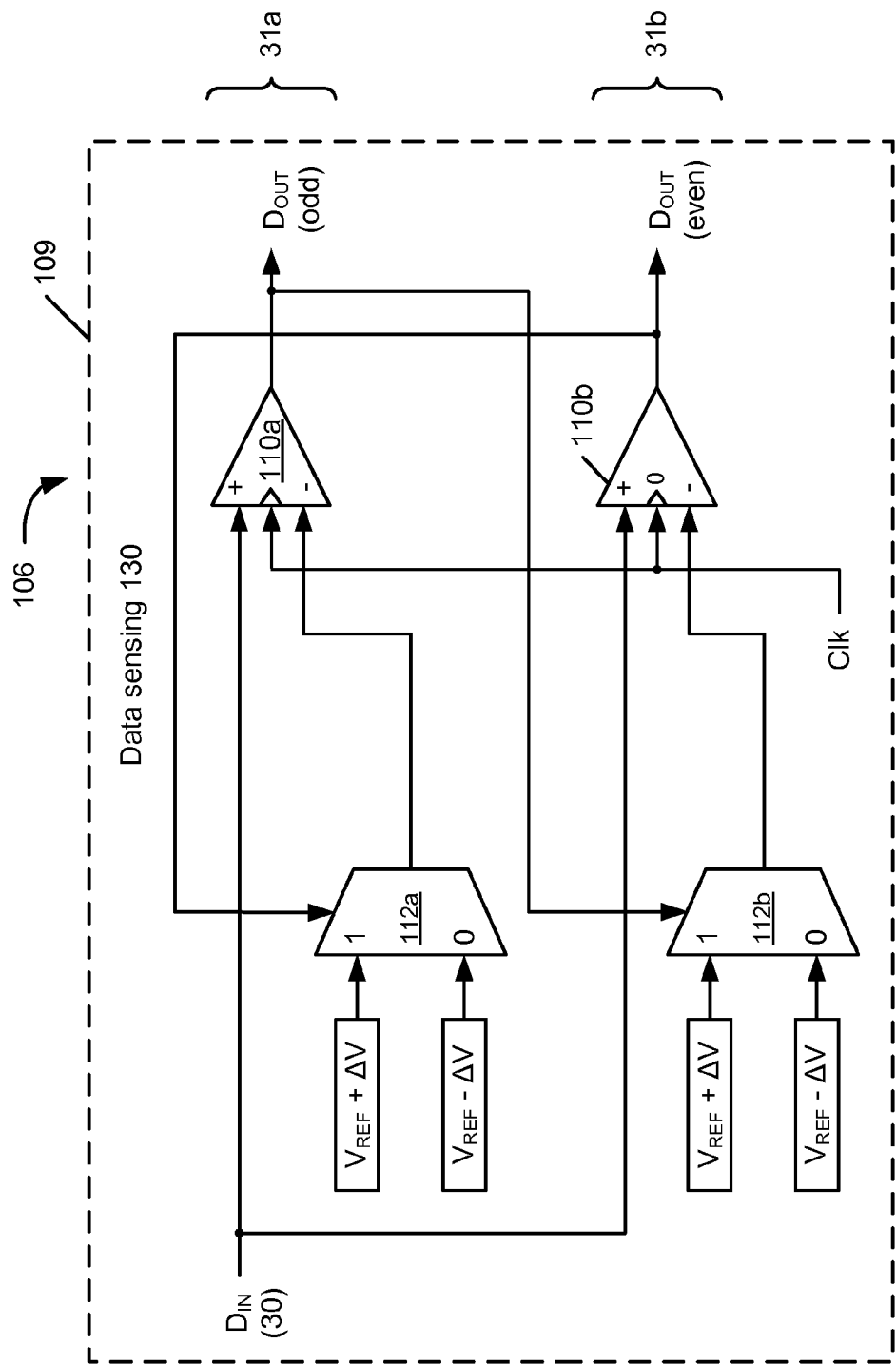
FIG. 9 shows a half-rate clock decision feedback equalizer in accordance with an embodiment of the invention.

Further, the reference voltage may be dynamically selected or adjusted in an equalizer circuit. FIG. 9 depicts an equalizer circuit 109 having a dynamically selectable sensing reference voltage, output by the multiplexers 112a and 112b. The equalizer circuit 109 depicts what may be regarded as a modification of a "standard" DFE circuit configuration, in which an output decision adjusts a reference voltage of a single comparator. However, the equalizer circuit 109 is modified in accordance with one or more embodiments of the invention to operate with a half-rate clock. As seen in FIG. 9, the comparators 110a, 110b are clocked on alternate halves of a clock signal Clk. The output of the comparator 110a in the input data path 31a is output to the multiplexer 112b in the input data path 31b, while the output of the comparator 110b is output to the multiplexer 112a in the input data path 31a. The multiplexers 112a, 112b in turn choose the appropriate reference voltage ($V_{REF}$+$\Delta V$ or $V_{REF}$−$\Delta V$) that is input into the comparators 110a, 110b for the next decision. One skilled in the art will appreciate that such a configuration is extendable to other clocking schemes, reference voltages, input data, etc., as discussed above in the various embodiments of the invention. One skilled in the art will also appreciate that the critical path allowing adequate timing for each data path 31a, 31b requires that each multiplexer 112a, 112b has received the output from the appropriate comparator 110b, 110a, and output an appropriate value before a next bit in the data signal $D_{IN}$ 30 is received.

While preferred embodiments of the invention have been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. An equalizer circuit for receiving a sequence of data bits from a data channel, comprising:
    a plurality of 'n' data paths for receiving the sequence of data bits, each data path comprising:
        at least first and second comparison devices for receiving the sequence of data bits, wherein the first comparison device further receives a first reference voltage and the second comparison device further receives a second reference voltage different from the first reference voltage, and
        a multiplexer for selectively coupling an output of one of the first and second comparison devices to a data path output,
    wherein the multiplexer in any given data path receives at least one data path output from a different data path at its control input, and wherein a first data path operates on one of a rising edge or a falling edge of the clock, and a second data path operates on the other one of the rising edge and the falling edge of the clock.

2. The equalizer circuit of claim 1, wherein each of the plurality of data paths cyclically samples every $n^{th}$ bit in the sequence of data bits.

3. The equalizer circuit of claim 2, further comprising clocking circuitry coupled to the data path outputs for forming a single data output line indicative of the received sequence of data bits.

4. The equalizer circuit of claim 1, wherein each data bit has a duration, and wherein each data path operates with a clock having a period of 'k' times the duration.

5. The equalizer circuit of claim 4, wherein the clock is received at the equalizer circuit from a clock channel.

6. The equalizer circuit of claim 1, wherein a midpoint reference voltage intervenes between the first reference voltage and the second reference voltage.

7. The equalizer circuit of claim 1, wherein the multiplexer in any given data path receives at least a second data path output from any data path at its control input.

8. The equalizer circuit of claim 1, wherein at least one of the first and second reference voltages is actively adjusted based on at least one data path output.

9. The equalizer circuit of claim 1, wherein the first and second reference voltages are affected by respectively using first and second currents in the first and second comparison devices.

10. An equalizer circuit for receiving a sequence of data bits from a data channel, and a clock signal, comprising:
   a plurality of 'n' data paths for receiving the sequence of data bits, wherein each data path comprises sensing circuitry for cyclically sampling every $n^{th}$ bit in the sequence of data bits and for producing an output;
   wherein the sensing circuitry in the $n^{th}$ data path receives the output from at least the $(n-1)^{th}$ data path, wherein the sensing circuitry in the first data path receives the output from at least the $n^{th}$ data path, and wherein each output influences sensing in the sensing circuitry to which it is coupled, and wherein the sensing circuitry in the $n^{th}$ data path comprises a dynamically selectable sensing reference voltage to compare with every $n^{th}$ bit in the sequence of data bits.

11. The equalizer circuit of claim 10, further comprising clocking circuitry coupled to the outputs for forming a single data output line indicative of the received sequence of data bits.

12. The equalizer circuit of claim 10, wherein each data bit has a duration, and wherein the data paths operate with a clock having a period of 'k' times the duration.

13. The equalizer circuit of claim 12, wherein the clock signal is received at the equalizer circuit from a clock channel.

14. The equalizer circuit of claim 12, wherein a first data path operates on one of a rising edge or a falling edge of the clock, and a second data path operates on the other one of the rising edge and the falling edge of the clock.

15. The equalizer circuit of claim 10, wherein
   if an output comprises a logic '0,' that output influences sensing in the sensing circuitry to which it is coupled by encouraging that sensing circuitry toward sensing a logic '1,' and
   if an output comprises a logic '1,' that output influences sensing in the sensing circuitry to which it is coupled by encouraging that sensing circuitry toward sensing a logic '0.'

16. The equalizer circuit of claim 10, wherein each output influences sensing in the sensing circuitry comprises choosing a different sensing reference voltage to compare with a received data bit.

17. The equalizer circuit of claim 10, wherein the sensing circuitry in the $n^{th}$ data path further receives the output from at least the $(n-2)^{th}$ data path, wherein the sensing circuitry in the first data path further receives the output from at least the $(n-1)^{th}$ data path, wherein the sensing circuitry in the second data path further receives the output from at least the $n^{th}$ data path, and wherein each output influences sensing in the sensing circuitry to which it is coupled.

18. The equalizer circuit of claim 10, wherein at least a current output influences sensing in the sensing circuitry to maximize a sensing margin in at least one future sensing decision.

19. A data communication system, comprising:
   a transmitter, wherein the transmitter transmits a sequence of data bits of a duration over at least one data channel; and
   a receiver for receiving the sequence of data bits and a clock signal, wherein the clock signal has a period of 'k' times the duration, wherein the receiver comprises an equalizer with 'n' data paths each comprising sensing circuitry for producing a data output, wherein the data outputs are indicative of the received sequence of data bits, wherein a logic state of a bit in one data output influences the sensing of at least one future bit in the received sequence of bits,
   wherein the clock signal is modified at the receiver into 'j' clock signals useable by the equalizer, wherein 'j' is equal to one-half the number of data paths 'n,' and wherein both rising and falling edges of the 'j' clock signals are used in the data capture process.

20. The data communication system of claim 19, wherein the received sequence of data bits is compared with at least one reference voltage level.

21. The data communication system of claim 19, wherein the clock signal is modified at the receiver into 'n' clock signals useable by the equalizer.

22. The data communication system of claim 19, wherein the logic state of a bit in at least one data output influences the sensing of at least one future bit in the received sequence of bits by encouraging the sensing of the at least one future bit in the received sequence toward the complement of the logic state.

23. The data communication system of claim 19, wherein a logic state of at least a current output influences sensing in the sensing circuitry to maximize a sensing margin in at least one future sensing decision.

24. The data communication system of claim 19, wherein the sensing circuitry in the $n^{th}$ data path comprises a dynamically adjustable sensing reference voltage to compare with every $n^{th}$ bit in the sequence of data bits.

25. The data communication system of claim 19, wherein the transmitter also transmits the clock signal over at least one clock channel.

26. The data communication system of claim 19, wherein each data path further comprises sensing circuitry for producing a delayed data output, wherein the delayed data outputs are indicative of the received sequence of data bits, wherein the logic state of a bit in at least one delayed data output influences the sensing of at least one future bit in the received sequence of bits.

27. An equalizer circuit comprising:
   a first data path and a second data path, each data path comprising:
      first and second comparison devices that receive a signal corresponding to a sequence of data digits, wherein the first comparison device compares an aspect of the signal corresponding to at least one of the digits to a first reference voltage and the second comparison device compares the aspect of the signal corresponding to the at least one of the digits to a second reference voltage different from the first reference voltage, and
      a multiplexer that selectively couples an output of one of the first and second comparison devices to a data path output, wherein the multiplexer in the second data path is controlled, at least in part, by the output of the multiplexer in the first data path, and wherein the comparison devices of the first data path compare the reference voltages to aspects of the signal corresponding to even-numbered bits from the sequence of data, and wherein the comparison devices of the second data path compare the reference voltages to aspects of the signal corresponding to odd-numbered bits from the sequence of data further comprising clocking circuitry coupled to the data path outputs that forms a single data output signal indicative of the received sequence of data bits.

28. The equalizer circuit of claim 27, wherein each aspect of the signal corresponding to one of the data bits has a duration, and wherein the first and second data paths operate with a clock having a period of twice the duration.

29. The equalizer circuit of claim 28, wherein the clock is received at the equalizer circuit from a clock channel.

30. The equalizer circuit of claim 28, wherein the first data path operates on one of a rising edge or a falling edge of the clock, and the second data path operates on the other one of the rising edge and the falling edge of the clock.

31. The equalizer circuit of claim 27, wherein the first reference voltage and the second reference voltage are equivalently offset from a midpoint reference voltage.

32. The equalizer circuit of claim 27, wherein the multiplexer in the first data path is controlled, at least in part, by the output of the multiplexer in the second data path.

33. The equalizer circuit of claim 27, wherein a multiplexer in a third data path is controlled, at least in part, by the output of the multiplexer in the second data path.

34. An equalizer circuit comprising:
a first data path that receives an input signal having aspects that correspond to a sequence of data digits, wherein the first data path comprises first selection circuitry that receives a signal having aspects that correspond to only some of the data digits in the sequence;
a second data path that receives the input signal, wherein the second data path comprises second selection circuitry that receives a signal having aspects that correspond to at least some of the data digits other than the only some of the data digits; and
wherein an output of the first selection circuitry influences an output of the second selection circuitry,
and wherein
if the output of the first selection circuitry corresponds to a logic '0,' the second selection circuitry is biased towards selecting a logic '1,'
if the output of the first selection circuitry corresponds to a logic '1,' the second selection circuitry is biased towards selecting a logic '0.'

35. The equalizer circuit of claim 34, further comprising clocking circuitry coupled to the outputs and that forms a single data output signal indicative of the sequence of data digits.

36. The equalizer circuit of claim 34, wherein each data bit has a duration, and wherein the first and second data paths operate with a clock having a period of twice the duration.

37. The equalizer circuit of claim 36, wherein the clock is received at the equalizer circuit from a clock channel.

38. The equalizer circuit of claim 36, wherein the first data path operates on one of a rising edge or a falling edge of the clock, and the second data path operates on the other one of the rising edge and the falling edge of the clock.

39. The equalizer circuit of claim 34, wherein influencing an output of the second selection circuitry comprises using a selected one of a plurality of reference voltages to compare with an aspect of the input signal.

40. A synchronous data communication system, comprising:
a transmitter, wherein the transmitter transmits a data input signal corresponding to a sequence of data digit having a duration over at least one data channel and a clock signal over at least one clock channel, wherein the clock signal has a period of twice the duration; and
a receiver that receives the data input signal and the clock signal, wherein the receiver comprises an equalizer with sensing circuitry active on both rising and falling edges of the clock signal to produce a data output signal indicative of the sequence of data bits, wherein a logic state of a digit in the sequence indicated by the data output signal influences sensing of a logic state of a next digit in the sequence of digits corresponding to the data input signal.

41. The system of claim 40, wherein the receiver comprises an SDRAM.

42. The system of claim 40, wherein the logic state of a digit in the sequence indicated by the data output signal influences the sensing of a logic state of a next digit in the sequence of digits corresponding to the data input signal by biasing sensing of the logic state of the next digit in the sequence towards the complement of the logic state of the digit in the sequence indicated by the data output signal.

43. A method for generating a reference voltage for use in a comparison device, comprising:
receiving from a transmission channel a first signal of a first frequency and a first voltage magnitude, wherein the first voltage magnitude deviates from an ideal because of intersymbol interference;
receiving from the transmission channel a second signal of a second frequency different from the first frequency and a second voltage magnitude different from the first voltage magnitude, wherein the second voltage magnitude deviates from the ideal because of intersymbol interference;
determining a difference between the first voltage magnitude and the second voltage magnitude; and
offsetting a mid-point reference voltage by the determined difference at a reference terminal of the comparison device, wherein the comparison device is used to sense an input data stream from the transmission channel.

44. The method of claim 43, wherein the first and second signals comprise periodic signals.

45. An equalizer circuit for receiving a sequence of data bits from a data channel, comprising:
a plurality of 'n' data paths for receiving the sequence of data bits, each data path comprising:
at least first and second comparison devices for receiving the sequence of data bits, wherein the first comparison device further receives a first reference voltage and the second comparison device further receives a second reference voltage different from the first reference voltage, and
a multiplexer for selectively coupling an output of one of the first and second comparison devices to a data path output, wherein the multiplexer in any given data path receives at least one data path output from a different data path at its control input, and wherein each of the plurality of data paths cyclically samples every $n^{th}$ bit in the sequence of data bits; and
clocking circuitry coupled to the data path outputs for forming a single data output line indicative of the received sequence of data bits.

46. An equalizer circuit for receiving a sequence of data bits from a data channel, comprising:
- a plurality of 'n' data paths for receiving the sequence of data bits, each data path comprising:
  - at least first and second comparison devices for receiving the sequence of data bits, wherein the first comparison device further receives a first reference voltage and the second comparison device further receives a second reference voltage different from the first reference voltage, and
  - a multiplexer for selectively coupling an output of one of the first and second comparison devices to a data path output,
- wherein the multiplexer in any given data path receives at least one data path output from a different data path at its control input, and wherein at least one of the first and second reference voltages is actively adjusted based on at least one data path output.

47. An equalizer circuit for receiving a sequence of data bits from a data channel, and a clock signal, comprising:
- a plurality of 'n' data paths for receiving the sequence of data bits, wherein each data path comprises sensing circuitry for cyclically sampling every $n^{th}$ bit in the sequence of data bits and for producing an output;
- wherein the sensing circuitry in the $n^{th}$ data path receives the output from at least the $(n-1)^{th}$ data path, wherein the sensing circuitry in the first data path receives the output from at least the $n^{th}$ data path, and wherein each output influences sensing in the sensing circuitry to which it is coupled,
- and wherein
- if an output comprises a logic '0,' that output influences sensing in the sensing circuitry to which it is coupled by encouraging that sensing circuitry toward sensing a logic '1,' and if an output comprises a logic '1,' that output influences sensing in the sensing circuitry to which it is coupled by encouraging that sensing circuitry toward sensing a logic '0.'

48. An equalizer circuit for receiving a sequence of data bits from a data channel, and a clock signal, comprising:
- a plurality of 'n' data paths for receiving the sequence of data bits, wherein each data path comprises sensing circuitry for cyclically sampling every $n^{th}$ bit in the sequence of data bits and for producing an output;
- wherein the sensing circuitry in the $n^{th}$ data path receives the output from at least the $(n-1)^{th}$ data path, wherein the sensing circuitry in the first data path receives the output from at least the $n^{th}$ data path, wherein each output influences sensing in the sensing circuitry to which it is coupled, wherein the sensing circuitry in the $n^{th}$ data path further receives the output from at least the $(n-2)^{th}$ data path, wherein the sensing circuitry in the first data path further receives the output from at least the $(n-1)^{th}$ data path, wherein the sensing circuitry in the second data path further receives the output from at least the $n^{th}$ data path, and wherein each output influences sensing in the sensing circuitry to which it is coupled.

49. A data communication system, comprising:
- a transmitter, wherein the transmitter transmits a sequence of data bits of a duration over at least one data channel; and
- a receiver for receiving the sequence of data bits and a clock signal, wherein the clock signal has a period of 'k' times the duration, wherein the receiver comprises an equalizer with 'n' data paths each comprising sensing circuitry for producing a data output, wherein the data outputs are indicative of the received sequence of data bits, wherein a logic state of a bit in one data output influences the sensing of at least one future bit in the received sequence of bits,
- wherein the logic state of a bit in at least one data output influences the sensing of at least one future bit in the received sequence of bits by encouraging the sensing of the at least one future bit in the received sequence toward the complement of the logic state.

50. A data communication system, comprising:
- a transmitter, wherein the transmitter transmits a sequence of data bits of a duration over at least one data channel; and
- a receiver for receiving the sequence of data bits and a clock signal, wherein the clock signal has a period of 'k' times the duration, wherein the receiver comprises an equalizer with 'n' data paths each comprising sensing circuitry for producing a data output, wherein the data outputs are indicative of the received sequence of data bits, wherein a logic state of a bit in one data output influences the sensing of at least one future bit in the received sequence of bits;
- wherein a logic state of at least a current output influences sensing in the sensing circuitry to maximize a sensing margin in at least one future sensing decision.

51. A data communication system, comprising:
- a transmitter, wherein the transmitter transmits a sequence of data bits of a duration over at least one data channel; and
- a receiver for receiving the sequence of data bits and a clock signal, wherein the clock signal has a period of 'k' times the duration, wherein the receiver comprises an equalizer with 'n' data paths each comprising sensing circuitry for producing a data output, wherein the data outputs are indicative of the received sequence of data bits, wherein a logic state of a bit in one data output influences the sensing of at least one future bit in the received sequence of bits,
- wherein the sensing circuitry in the $n^{th}$ data path comprises a dynamically adjustable sensing reference voltage to compare with every $n^{th}$ bit in the sequence of data bits.

52. A data communication system, comprising:
- a transmitter, wherein the transmitter transmits a sequence of data bits of a duration over at least one data channel; and
- a receiver for receiving the sequence of data bits and a clock signal, wherein the clock signal has a period of 'k' times the duration, wherein the receiver comprises an equalizer with 'n' data paths each comprising sensing circuitry for producing a data output, wherein the data outputs are indicative of the received sequence of data bits, wherein a logic state of a bit in one data output influences the sensing of at least one future bit in the received sequence of bits, wherein each data path further comprises sensing circuitry for producing a delayed data output, wherein the delayed data outputs are indicative of the received sequence of data bits, wherein the logic state of a bit in at least one delayed data output influences the sensing of at least one future bit in the received sequence of bits.

53. An equalizer circuit comprising:
- a first data path and a second data path, each data path comprising:
  - first and second comparison devices that receive a signal corresponding to a sequence of data digits, wherein the first comparison device compares an aspect of the signal corresponding to at least one of the digits to a first reference voltage and the second comparison device compares the aspect of the signal corresponding to the at least one of the digits to a second reference voltage different from the first reference voltage, and a multiplexer that selectively couples an output of one of the first and second comparison devices to a data path output, wherein the multiplexer in the second data path is controlled, at least in part, by the output of the multiplexer in the first data path, and wherein a multiplexer in a third data path is controlled, at least in part, by the output of the multiplexer in the second data path.

54. The equalizer circuit of claim 53, wherein the multiplexer in the first data path is controlled, at least in part, by an output of the multiplexer in the third data path.

55. The equalizer circuit of claim 53, wherein a multiplexer in a fourth data path is controlled, at least in part, by the output of the multiplexer of the third data path, and wherein the multiplexer of the first data path is controlled, at least in part, by an output of the multiplexer in the fourth data path.

* * * * *

UNITED STATES PATENT AND TRADEMARK OFFICE
CERTIFICATE OF CORRECTION

| | | |
|---|---|---|
| PATENT NO. | : 7,936,812 B2 | |
| APPLICATION NO. | : 11/772642 | |
| DATED | : May 3, 2011 | |
| INVENTOR(S) | : Timothy M. Hollis | |

It is certified that error appears in the above-identified patent and that said Letters Patent is hereby corrected as shown below:

In column 15, lines 19-38, delete "47. An equalizer circuit for receiving a sequence of data bits from a data channel, and a clock signal, comprising:

a plurality of 'n' data paths for receiving the sequence of data bits, wherein each data path comprises sensing circuitry for cyclically sampling every $n^{th}$ bit in the sequence of data bits and for producing an output;

wherein the sensing circuitry in the $n^{th}$ data path receives the output from at least the $(n-1)^{th}$ data path, wherein the sensing circuitry in the first data path receives the output from at least the $n^{th}$ data path, and wherein each output influences sensing in the sensing circuitry to which it is coupled, and wherein if an output comprises a logic '0,' that output influences sensing in the sensing circuitry to which it is coupled by encouraging that sensing circuitry toward sensing a logic '1,' and if an output comprises a logic '1,' that output influences sensing in the sensing circuitry to which it is coupled by encouraging that sensing circuitry toward sensing a logic '0.'" and insert -- 47. An equalizer circuit for receiving a sequence of data bits from a data channel, and a clock signal, comprising:

a plurality of 'n' data paths for receiving the sequence of data bits, wherein each data path comprises sensing circuitry for cyclically sampling every $n^{th}$ bit in the sequence of data bits and for producing an output;

wherein the sensing circuitry in the $n^{th}$ data path receives the output from at least the $(n-1)^{th}$ data path, wherein the sensing circuitry in the first data path receives the output from at least the $n^{th}$ data path, and wherein each output influences sensing in the sensing circuitry to which it is coupled, and wherein if an output comprises a logic '0,' that output influences sensing in the sensing circuitry to which it is coupled by encouraging that sensing circuitry toward sensing a logic '1,' and if an output comprises a logic '1,' that output influences sensing in the sensing circuitry to which it is coupled by encouraging that sensing circuitry toward sensing a logic '0.' --, therefor.

Signed and Sealed this
Twelfth Day of July, 2011

David J. Kappos
*Director of the United States Patent and Trademark Office*

CERTIFICATE OF CORRECTION (continued)
U.S. Pat. No. 7,936,812 B2

In column 16, lines 41-59, delete "52. A data communication system, comprising:

a transmitter, wherein the transmitter transmits a sequence of data bits of a duration over at least one data channel; and a receiver for receiving the sequence of data bits and a clock signal, wherein the clock signal has a period of 'k' times the duration, wherein the receiver comprises an equalizer with 'n' data paths each comprising sensing circuitry for producing a data output, wherein the data outputs are indicative of the received sequence of data bits, wherein a logic state of a bit in one data output influences the sensing of at least one future bit in the received sequence of bits, wherein each data path further comprises sensing circuitry for producing a delayed data output, wherein the delayed data outputs are indicative of the received sequence of data bits, wherein the logic state of a bit in at least one delayed data output influences the sensing of at least one future bit in the received sequence of bits." and insert -- 52. A data communication system, comprising:

a transmitter, wherein the transmitter transmits a sequence of data bits of a duration over at least one data channel; and a receiver for receiving the sequence of data bits and a clock signal, wherein the clock signal has a period of 'k' times the duration, wherein the receiver comprises an equalizer with 'n' data paths each comprising sensing circuitry for producing a data output, wherein the data outputs are indicative of the received sequence of data bits, wherein a logic state of a bit in one data output influences the sensing of at least one future bit in the received sequence of bits, wherein each data path further comprises sensing circuitry for producing a delayed data output, wherein the delayed data outputs are indicative of the received sequence of data bits, wherein the logic state of a bit in at least one delayed data output influences the sensing of at least one future bit in the received sequence of bits. --, therefor.